United States Patent
Nakao

[11] Patent Number: 5,882,827
[45] Date of Patent: *Mar. 16, 1999

[54] PHASE SHIFT MASK, METHOD OF MANUFACTURING PHASE SHIFT MASK AND METHOD OF FORMING A PATTERN USING PHASE SHIFT MASK

[75] Inventor: Shuji Nakao, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 791,432

[22] Filed: Jan. 27, 1997

[30] Foreign Application Priority Data

Aug. 26, 1996 [JP] Japan .................................. 8-223724

[51] Int. Cl.$^6$ ........................................................ G03F 9/00
[52] U.S. Cl. .............................................. 430/5; 430/311
[58] Field of Search ........................... 430/5, 311, 322, 430/323, 324

[56] References Cited

FOREIGN PATENT DOCUMENTS

| 0 713 142 A2 | 5/1996 | European Pat. Off. . |
| 6-123961 | 5/1994 | Japan . |
| 7-168342 | 7/1995 | Japan . |

*Primary Examiner*—S. Rosasco
*Attorney, Agent, or Firm*—McDermott, Will & Emery

[57] ABSTRACT

A phase shift mask has phase shift portions of both Levenson type and Halftone type. At the phase shift portion of Levenson type, formed are first and second light transmitting regions and transmitting exposure light of different phases, as well as a shading region constituted by a stacked structure of a semi-shading shifter film and a shading film. At the phase shift portion of Halftone type, a third light transmitting region where a surface of a quarts substrate is exposed, and a fourth light transmitting region having the semi-shading shifter film on the surface of the quartz substrate are provided. A phase shift mask, a method of manufacturing the phase shift mask and a method of forming a pattern using the phase shift mask can thus be obtained in which a highly precise alignment mark is unnecessary, a process for manufacturing is simple, and a defect can easily be removed.

5 Claims, 12 Drawing Sheets

ELECTRIC
FIELD ON
MASK

LIGHT
INTENSITY
ON WAFER

ELECTRIC FIELD ON MASK

LIGHT INTENSITY ON WAFER

ELECTRIC FIELD ON MASK

LIGHT INTENSITY ON WAFER

PHASE SHIFT MASK, METHOD OF MANUFACTURING PHASE SHIFT MASK AND METHOD OF FORMING A PATTERN USING PHASE SHIFT MASK

BACKGROUND OF THE INVENTION

1. Field of the Invention

The present invention relates to a phase shift mask, a method of manufacturing the phase shift mask and a method of forming a pattern using the phase shift mask. The invention more particularly relates to a phase shift mask provided with phase shift portions of Levenson type and Halftone type, a method of manufacturing the phase shift mask and a method of forming a pattern using the phase shift mask.

2. Description of the Background Art

As higher integration and miniaturization have been achieved in a semiconductor integrated circuit, miniaturization of a circuit pattern formed on a semiconductor substrate (hereinafter simply referred to as a wafer) has also been proceeded.

As a basic technique for generating the pattern, photolithography is widely known among others. Although various development and improvement have been made in the field, dimension of the pattern has still become smaller, and requirement for improved resolution of the pattern has also become stronger.

According to the photolithography technique, a mask (original) pattern is transferred to a photoresist coating a wafer, and underlying film to be etched is patterned using the photoresist. At the time of the transfer, the photoresist is developed. Through the development process, the photoresist of the type in which a portion exposed to light is removed is called a positive type, while the type in which a portion not exposed to light is removed is called a negative type photoresist.

Resolution limit R (nm) in the photolithography employing the demagnification exposure method is represented as $$R = k_1 \cdot \lambda / (NA)$$

where $\lambda$ is wavelength (nm) of the light used, NA is numerical aperture of a lens and $k_1$ is a constant dependent on the resist process.

As can be appreciated from above equation, in order to improve the resolution limit R to obtain a fine pattern, the values $K_1$ and $\lambda$ should be smaller, and the value NA should be larger. In other words, what is required is to reduce the constant dependent on the resist process as well as to shorten the wavelength and to increase NA. However, improvement of light source or the lens is technically difficult, and depth of focus $\delta$ ($\delta = k_2 \; A \; \lambda / (NA)^2$) of light might become shallower by shortening the wavelength and increasing NA, thus causing deterioration of the resolution.

In view of this, studies of miniaturization of the pattern by improving not the light source or the lens but the photomask are proceeded. Lately, a phase shift mask has been attracting much attention as a photomask allowing improvement of the resolution of the pattern. The structure and principle of such a phase shift mask will be hereinafter described in comparison with an ordinary photomask. The description below will be directed to a phase shift mask of the Levenson type and that of the Halftone type.

FIGS. 10A, 10B, and 10C respectively show a cross section of a mask, electric field on the mask, and light intensity on a wafer when an ordinary mask is used. With reference to FIG. 10A, the ordinary photomask is structured to have a metal mask pattern 103 formed on a glass substrate 101. The electric field on such an ordinary photomask is pulse modulated spacially by metal mask pattern 103 as shown in FIG. 10B.

Referring to FIG. 10C, if the pattern has smaller dimension, exposure light transmitted through the photomask extends into a non-exposed region (a region where transmission of the exposure light is blocked by metal mask pattern 103) on the wafer due to the diffraction effect of the light. The light is thus directed to a region not to be exposed on the wafer, resulting in deterioration of contrast of light (difference of light intensity between an exposed region and a non-exposed region on a wafer). The resolution is degraded and transfer of a fine pattern becomes difficult.

FIGS. 11A, 11B, and 11C respectively show a cross section of a mask, electric field on the mask, and light intensity on a wafer when a phase shift mask of Levenson type is used. With reference to FIG. 11A, an optical member called phase shifter 105 is provided on an ordinary photomask.

More specifically, chromium mask pattern 103 is formed on glass substrate 101 to provide an exposure region and a shading region, and phase shifter 105 is formed at every other exposure region. Phase shifter 105 has a function of shifting the phase of the transmitted light by 180°.

Referring to FIG. 11B, in the electric field on the mask generated by the light transmitted through the phase shift mask, the phases are alternately inverted by 180° since phase shifters 105 are provided at every other exposure region. As described above, adjacent exposed regions have opposite phases of light, so that beams of light cancel each other out due to the interference of light in the portions where light beams of opposite phases are overlapped.

As a result, as shown in FIG. 11C, the intensity of the light becomes weak in the boundary portion between the exposed regions, then sufficient difference of light intensity between the exposed region and the non-exposed region on the wafer can be obtained. The improvement of the resolution is thus possible to allow the transfer of a fine pattern.

FIGS. 12A, 12B, and 12C respectively show a cross section of a mask, electric field on the mask, and light intensity on a wafer when a phase shift mask of the Halftone type is used. With reference to FIG. 12A first, the phase shift mask of the Halftone type is also provided with an optical member called phase shifter 106 as the phase shift mask of the Levenson type described above.

Optical member 106 is deposited on only a semitransparent film 103 on glass substrate 101. Phase shifter 106 and semitransparent film 103 thus constitute a double layered structure. Phase shifter 106, as described above, has a function of shifting the phase of the transmitted light by 180°, and semitransparent film 103 has a function of attenuating the intensity of the exposure light without blocking it completely.

Referring to FIG. 12B, since the double layered structure of phase shifter 106 and semitransparent film 103 is provided, phases of the electric field on the mask are alternately inverted by 180°, and intensity of one phase becomes smaller than that of the other phase. As a result, the phase of light is shifted by 180° by transmission through phase shifter 106, and the intensity of light is attenuated by transmission through semitransparent film 103 such that a prescribed thickness of the film of the photoresist is left after development. Phases of light are reversed at exposure regions adjacent to each other, so that light is canceled out at a portion where the light beams of opposite phases overlap.

As a result, as shown in FIG. 12C, light intensity can be reduced at an edge portion of the exposed pattern since phases are reversed at the edge portion of the exposed pattern. Accordingly, difference of the light intensity of the exposure light transmitted through semitransparent film 103 and not transmitted therethrough increases at corresponding regions, and resolution of a pattern image can be enhanced.

There are various types of the phase shift mask, including the Levenson type and the Halftone type. The phase shift mask of the Levenson type is known to be effective for a densely formed line/space pattern. The mask is also effective for producing an isolated dark line. More specifically, an isolated dark line of high resolution can be obtained by increasing width Ln and La of light transmitting regions and decreasing width Ls of the shading region sandwiched between the light transmitting regions in FIG. 11.

However, it is difficult to produce an isolated bright line using the phase shift mask of the Levenson type. In FIG. 11, an isolated bright line can be generated by increasing width Ls of the shading region and decreasing the width La (or Ln) of the transmitting region sandwiched between the shading regions. However, there is no interference of exposure light transmitted through transmitting portions adjacent to each other, so that high resolution cannot be obtained when an isolated bright line is to be formed.

On the other hand, according to an exposure method using the phase shift mask of the Halftone type described above, resolution of an isolated bright line can be improved. Therefore, if the masks of these two types can be fabricated on a same mask substrate, densely formed lines, an isolated bright line, and an isolated dark line of high resolution can simultaneously be obtained.

A mask structure and a method of manufacturing the mask structure for achieving the effect above are proposed in Japanese Patent Laying-Open Nos. 7-168342 and 6-123961. Phase shift masks disclosed in the Japanese Patent Laying-Open Nos. 7-168342 and 6-123961 are hereinafter described as a first conventional example and a second conventional example, respectively.

FIG. 13 is a cross sectional view schematically showing a structure of a phase shift mask according to the first conventional example. With reference to FIG. 13, a transparent substrate 201 is provided with a trench 201a, providing first and second light transmitting regions Tn and Ta having phases of light shifted by 180° to each other. Between the first and the second light transmitting regions Tn and Ta, a semi-shading region S is produced by forming a semi-shading film 203 which covers a sidewall of trench 201a.

In a phase shift mask 210, a phase shift effect of the Halftone type is obtained by providing semi-shading film 203 having a width Ls greater than a prescribed dimension, and a phase shift effect of the Levenson type is achieved by providing semi-shading film 203 having the width Ls smaller than a prescribed dimension. By appropriately setting the width Ls of semi-shading film 203, both of the phase shift portion of the Levenson type and that of the Halftone type can be produced on the same mask.

A method of manufacturing the phase shift mask is hereinafter described.

FIGS. 14–17 are schematic cross sectional views showing a method of manufacturing the phase shift mask according to the first conventional example, following the order of process steps. With reference to FIG. 14, a chromium film 205 is deposited on a surface of a quartz substrate 201 and a resist pattern 207 is formed on chromium film 205. Chromium film 205 is patterned by anisotropic etching using resist pattern 207 as a mask. Resist pattern 207 is thereafter stripped.

Referring to FIG. 15, quartz substrate 201 is anisotropically etched using chromium film pattern 205 as a mask. A shifter pattern is transferred onto the substrate by providing trench 201a on the surface of quartz substrate 201. Chromium film pattern 205 is thereafter removed.

With reference to FIG. 16, the entire surface of quartz substrate 201 is exposed by the removal of chromium film pattern 205.

Referring to FIG. 17 next, a chromium film 203 is formed on the entire surface and a resist pattern 209 is formed on chromium film 203. Chromium film 203 is anisotropically etched using resist pattern 209 as a mask. Chromium film 203 is thus patterned exposing the first and second light transmitting regions while being left on the semi-shading region sandwiched between the first and second light transmitting regions. Resist pattern 209 is thereafter stripped and phase shift mask 210 illustrated in FIG. 13 is completed.

FIG. 18 schematically shows a cross section of a structure of the phase shift mask according to the second conventional example. With reference to FIG. 18, a phase shift mask 310 is provided with a phase shift mask portion of the Levenson type and that of the Halftone type. An etching stop film 303 is provided on an entire surface of a quartz substrate 301.

At the phase shift portion of the Levenson type, a shift layer 305 divided into a plurality of pieces is formed on etching stop film 303. A shading film 307 is formed on an edge portion of phase first layer 305 such that it partially exposes the surface of phase shift layer 305.

On the other hand, at the phase shift portion of the Halftone type, phase shift layer 305 divided into a plurality of pieces is formed on etching stop film 303. Semi-shading film 309 is provided such that it covers an entire surface of phase shift layer 305.

As clearly illustrated in FIG. 18, both of the phase shift portion of the Levenson type and that of the Halftone type are fabricated on the same mask.

A method of manufacturing the phase shift masks will be described.

FIGS. 19–23 are cross sectional views schematically showing the method of manufacturing the phase shift mask according to the second conventional example, following the order of process steps. First with reference to FIG. 19, etching stop film 303, phase shift layer 305, and shading film 307 are successively formed on quartz glass substrate 301. A resist pattern 311a is deposited on shading film 307. Shading film 307 is anisotropically etched using resist pattern 311a as a mask. Resist pattern 311a is thereafter removed.

Referring to FIG. 20, a plurality of pieces of shading film 307 separated from each other on phase shift layer 305 are formed at the phase shift portion of the Levenson type through this etching.

Referring to FIG. 21, semi-shading film 309 is formed to cover the entire surface of shading film 307 and phase shift layer 305.

Referring to FIG. 22, a resist pattern 311b having a prescribed shape is deposited on semi-shading film 309. Semi-shading film 309 and phase shift layer 305 are successively etched using resist pattern 311b as a mask. Resist pattern 311b is thereafter stripped. With reference to FIG. 23 next, a resist pattern 311c is further formed such that it covers the phase shift portion of the Halftone type. Semi-shading film 309 of the phase shift portion of the Levenson type is etched using resist pattern 311c as a mask and thereafter removed, thereby completing phase shift mask 310 shown in FIG. 18.

According to the first and the second conventional examples described above, a phase shift mask provided with a phase shift portion of the Levenson type and that of the Halftone type can be obtained.

However, in the first conventional example, the formation and patterning of semi-shading film 203 are carried out after the formation of trench 201a as shown in FIG. 17. In order to ensure satisfactory function of a phase shift mask of the Levenson type, semi-shading film 203 should be formed to exactly cover a sidewall of trench 201a which is a boundary portion of the regions having different light phases from each other. A problem of this example is that a highly precise alignment between semi-shading film 203 and an underlying shifter pattern is required when semi-shading film 203 is patterned.

In the second conventional example, phase shift layer 305 and semi-shading film 309 should be formed separately at the phase shift portion of the Halftone type as shown in FIGS. 19 and 21. A problem in this example is that the number of film formation steps increases and the process of manufacturing becomes complex, resulting in higher cost of manufacturing.

In the step of manufacturing a mask, a defect must be removed after patterning each film. However, in the second conventional example, removing the defect becomes difficult because of the increased number of film formation steps.

Furthermore, in the first conventional example, chromium film 203 is formed after the formation of the shifter pattern at quartz substrate 201 as shown in FIG. 16. When the shifter pattern is formed at quartz substrate 201 or after the formation, it is highly likely that a foreign matter is trapped in trench 201a. If chromium film 203 is formed having the foreign matter trapped as shown in FIG. 17, chromium film 203 could be broken due to the foreign matter. This leads to a problem that chromium film 203 tends to have a defect.

In the second conventional example, semi-shading film 309 is formed after the patterning of shading film 307 as shown in FIGS. 20 and 21, so that semi-shading film 309 is also likely to have a defect as in the first conventional example.

SUMMARY OF THE INVENTION

An object of the present invention is to provide a phase shift mask, a method of manufacturing the phase shift mask, and a method of forming a pattern using the phase shift mask in which highly precise alignment is unnecessary, a process of manufacturing is simple, and the number of defects is fewer.

A method of manufacturing a phase shift mask provided with a phase shift portion of the Levenson type and that of the Halftone type according to the present invention includes following steps.

A semi-shading shifter film and a shading film are successively deposited on an entire surface of a substrate. The semi-shading shifter film is formed such that it has a transmittance of at least 3% and at most 30%, and that a phase of exposure light before transmitted through the semi-shading shifter film is different from that after transmitted therethrough. By selectively removing the shading film and the semi-shading shifter film, the shading film and the semi-shading shifter film expose first and second light transmitting regions adjacent to each other with a shading region of the phase shift portion of the Levenson type therebetween, as well as a fourth light transmitting region adjacent to a third light transmitting region of the phase shift portion of the Halftone type, and cover the surface of the substrate at the shading region of the phase shift portion of the Levenson type and the third light transmitting region of the phase shift portion of the Halftone type. A trench is formed at the entire surface of the substrate exposed at either the first or the second light transmitting regions by etching using the selectively removed semi-shading shifter film as a mask such that a phase of exposure light transmitted through the first light transmitting region is different from that transmitted through the second light transmitting region. The shading film of the third light transmitting region is then removed.

In the method of manufacturing a phase shift mask according to the present invention, a trench is provided at a substrate through etching using a selectively removed (patterned) semi-shading shifter film as a mask. In other words, after patterning the semi-shading shifter film, an underlying shifter pattern is formed. Therefore, patterning of the semi-shading shifter film after the formation of the underlying shifter pattern is not required, thereby avoiding highly precise alignment at the time of the patterning of the semi-shading shifter film.

A semi-shading shifter film which attenuates intensity of exposure light and converts its phase by 180° is used. Therefore, at the phase shift portion of the Halftone type, a semi-shading film and a shifter film may not be formed separately. The number of the steps of film formation can be decreased compared with the second conventional example, thereby simplifying the manufacturing process.

A film other than a resist may not be formed after a blank is prepared. A defect of a film caused by newly forming a film after patterning a film of the blank or a substrate can be avoided. A phase shift mask having fewer defects can thus be fabricated.

A phase shift mask according to the present invention is provided with a phase shift portion of the Levenson type and a phase shift portion of the Halftone type, and includes a substrate, a semi-shading shifter film and a shading film. The substrate includes a first light transmitting region which allows transmission of exposure light at the phase shift portion of the Levenson type, and a second light transmitting region adjacent to the first light transmitting region with a shading region therebetween, which allows transmission of exposure light having a phase different from that transmitted through the first light transmitting region, as well as third and fourth light transmitting regions adjacent to each other and allow transmission of exposure light at the phase shift portion of the Halftone type. The semi-shading shifter film covers a surface of the substrate at the shading region and the third light transmitting region and exposes a surface of the substrate at the first, second, and fourth light transmitting regions. The shading film covers the entire surface of the semi-shading shifter film at the shading region, exposes a surface of the semi-shading shifter film at the third light transmitting region, and exposes a surface of the substrate at the first, second and fourth light transmitting regions. The semi-shading shifter film is formed such that it has a transmittance of at least 3% and at most 30%, and that a phase of the exposure light before transmitted through the semi-shading shifter film is different from that after transmitted therethrough.

A phase shift mask according to another aspect of the present invention is provided with a substrate, a semi-shading shifter film, and a shading film. The substrate includes a first light transmitting region transmitting exposure light and a second light transmitting region adjacent to the first light transmitting region with a shading region therebetween and transmitting exposure light having a phase different from that transmitted through the first light transmitting region. The semi-shading shifter film covers a surface of the substrate at the shading region and exposes a surface of the substrate at the first and second light transmitting regions. The shading film covers the entire surface of the semi-shading shifter film at the shading region and exposes a surface of the substrate at the first and second light transmitting regions. The semi-shading shifter film is formed such that it has a transmittance of at least 3% and at most 30%, and a phase of exposure light before transmitted through the semi-shading shifter film is different from that after transmitted therethrough.

In the phase shift mask according to above described two aspects of the present invention, a highly precise alignment is unnecessary, the manufacturing process can be simplified, and the number of defects can be decreased.

According to a method of forming a pattern using a phase shift mask of the present invention, exposure is carried out for a prescribed region of a photoresist applied to a wafer using the phase shift mask. The phase shift mask is provided with a substrate, a semi-shading shifter film and a shading film. The substrate includes a first light transmitting region which allows transmission of exposure light at the phase shift portion of the Levenson type, and a second light transmitting region adjacent to the first light transmitting region with a shading region therebetween, which allows transmission of exposure light having a phase different from that transmitted through the first light transmitting region, as well as third and fourth light transmitting regions adjacent to each other and allow transmission of exposure light at the phase shift portion of the Halftone type. The semi-shading shifter film covers a surface of the substrate at the shading region and the third light transmitting region and exposes a surface of the substrate at the first, second, and fourth light transmitting regions. The shading film covers the entire surface of the semi-shading shifter film at the shading region, exposes a surface of the semi-shading shifter film at the third light transmitting region and exposes a surface of the substrate at first, second and fourth light transmitting regions. The semi-shading shifter film is formed such that it has a transmittance of at least 3% and at most 30%, and that a phase of the exposure light before transmitted through the semi-shading shifter film is different from that after transmitted therethrough. Exposure light transmitted through the phase shift mask is directed to the photoresist. The exposed photoresist is patterned through development.

According to the method of forming a pattern using the phase shift mask of the present invention, high resolution is achieved both at the phase shift portion of the Levenson type and that of the Halftone type. The high resolution of densely formed lines, an isolated bright line, and an isolated dark line can thus be attained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described based on attached figures.

Figure 1A:
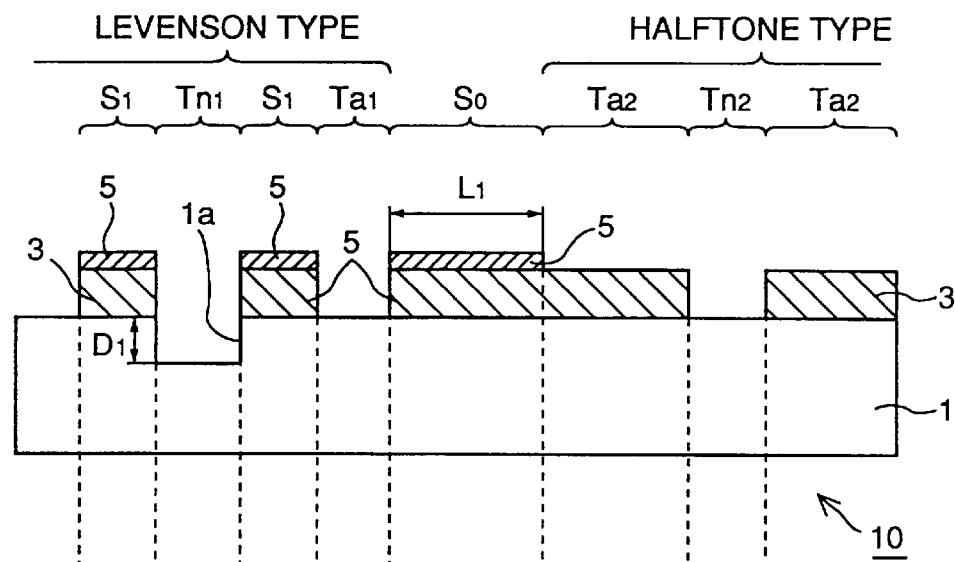
FIG. 1A schematically shows a cross section of a structure of a phase shift mask according to one embodiment of the present invention.

With reference to FIG. 1A, a phase shift mask 10 according to this embodiment has a phase shift portion of the Levenson type and a phase shift portion of the Halftone type. The Levenson type phase shift portion of a quartz substrate 1 is provided with a trench 1a. A first light transmitting region $Tn_1$ is formed of a region having trench 1a, and a second light transmitting region $Ta_1$ is formed of a region without trench 1a. The first light transmitting region $Tn_1$ and the second light transmitting region $Ta_1$ are structured such that phase of exposure light transmitted through one region is different from that transmitted through the other region by 180°.

A shading region $S_1$ is arranged between the first light transmitting region $Tn_1$ and the second light transmitting region $Ta_1$. A semi-shading shifter film 3 and a shading film 5 are stacked on a surface of quartz substrate 1 at shading region $S_1$.

The phase shift portion of the Halftone type has third and fourth light transmitting regions $Tn_2$ and $Ta_2$ surface of quartz substrate 1 is exposed at the third light transmitting region $Tn_2$. Semi-shading shifter film 3 having a transmittance of at least 3% and at most 30% is formed on quartz substrate 1 at the fourth light transmitting region $Ta_2$. A surface of semi-shading shifter film 3 is exposed without shading film thereon. Semi-shading shifter film 3 is formed at the fourth light transmitting region $Ta_2$, whereby the phase of exposure light transmitted through the third light transmitting region $Tn_2$ is different from that transmitted through the fourth light transmitting region $Ta_2$ by 180°.

A shading region So is provided between the Levenson type phase shift portion and Halftone type phase shift portion. Semi-shading shifter layer 3 and shading film 5 are stacked on quartz substrate 1 at shading region So.

Semi-shading shifter film 3 functions as a phase shifter of the Halftone type when it is formed, for example, of $MoSiO_xN_y$. In this case, semi-shading shifter film 3 has a transmittance of 4% and a refractive index of 1.9 for i-line (wavelength 365 nm), and has a thickness of 1980 Å, and is further formed such that half wave optical path length for the shifter film is longer than that for a layer of air having a comparative thickness.

Shading film 5 is formed, for example, of Cr (chromium), on the entire surface of semi-shading shifter film 3. Shading film 5 has a thickness of 1000 Å, optical density of 3, and a transmittance of 0.1%, and substantially functions as a shading film.

In order to obtain phase difference between first and second light transmitting regions $Tn_1$ and $Ta_1$, a depth $D_1$ of trench 1a is approximately 4050 Å when, for example, i-line is utilized as exposure light, and approximately 2720 Å when KrF excimer laser light is used.

Figure 1B:
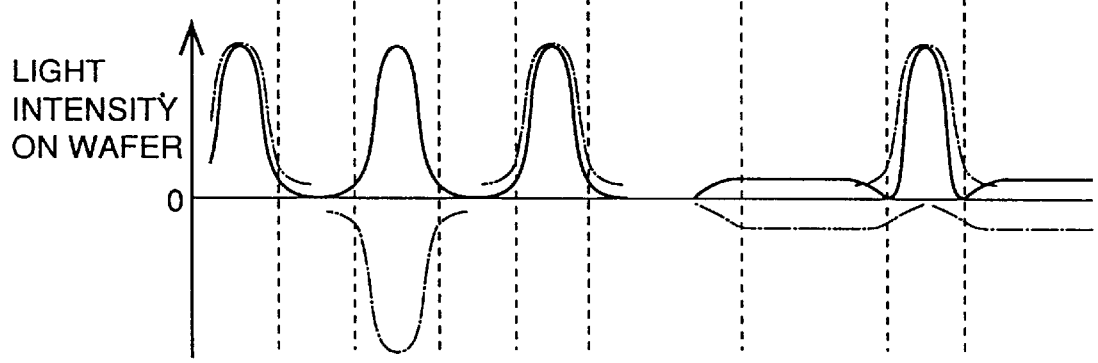
FIG. 1B shows light intensity of exposure light on a wafer, transmitted through the phase shift mask of FIG. 1A.

Referring to FIG. 1B, exposure light transmitted through the first light transmitting region $Tn_1$ and that transmitted through the second light transmitting region $Ta_1$ at the phase shift portion of the Levenson type have phases different from each other by substantially 180° as shown by the chain lines in the figure, and they are overlapped with each other in shading region $S_1$. The exposure light overlapped with each other has different phases, thereby canceling each other out. As shown by the solid line in the figure, light intensity of the exposure pattern always has 0 portion at shading region $S_1$. Accordingly, sufficient difference of the light intensity between first and second light transmitting regions $Tn_1$, $Ta_1$ and shading region $S_1$ can be obtained.

Semi-shading shifter film 3 has a transmittance of at least 3% and at most 30% at the phase shift portion of the Halftone type, attenuates intensity of exposure light, and further shifts the phase of the transmitted light by 180°. Therefore, the fourth light transmitting region $Ta_2$ also passes a certain amount of light therethrough. As a result, exposure light transmitted through the third light transmitting region $Tn_2$ and that transmitted through the fourth light transmitting region $Ta_2$ respectively have phases different from each other by substantially 180° as shown by the chain line in the figure, and overlap with each other at an edge portion of the exposure pattern. The overlapped exposure light has different phases and cancels out each other. Light intensity of the exposure pattern thus always has 0 portion at the edge portion as shown by the solid line in the figure. The shape of the exposure pattern at the edge portion becomes sharp as shown, so that resolution can be enhanced.

In FIG. 1B, at the second and third light transmitting regions $Ta_1$ and $Tn_2$, although the solid line and the chain line showing light intensity on the wafer actually overlap near the peak portion, the solid and chain lines are shown to be shifted for convenience of description.

As described above, high resolution is achieved both at the phase shift portion of the Levenson type and that of the Halftone type in the phase shift mask according to the present embodiment. The high resolution of densely formed lines, an isolated bright line, and an isolated dark line can be attained.

Next, a method of patterning a photoresist utilizing the phase shift mask according to this embodiment will be described.

Exposure light transmitted through the phase shift mask is directed to the photoresist applied to a wafer by, for example, demagnification exposure method. The distribution of intensity of the exposure light transmitted through the phase shift mask on the wafer is shown in FIG. 1B. After the exposure, the photoresist is developed and patterned into a prescribed shape.

When the photoresist is, for example, of positive type, the portion of the photoresist which has been exposed using light having intensity higher than a prescribed one in FIG. 1B is removed through development. In other words, the portion of the photoresist to which the exposure light transmitted through the first through the third light transmitting regions $Tn_1$, $Ta_1$ and $Tn_2$ is directed is removed. If the photoresist is, for example, of negative type, the portion of the photoresist which has been exposed using light of lower intensity than prescribed one in FIG. 1B is removed through development. In other words, the portion of the photoresist to which exposure light transmitted through the fourth light transmitting region $Ta_2$ and shading regions $S_0$ and $S_1$ is directed is removed.

An underlying film to be etched can be patterned into a desired shape through etching using the patterned photoresist as a mask.

A method of manufacturing the phase shift mask according to the embodiment is hereinafter described.

Figure 2:
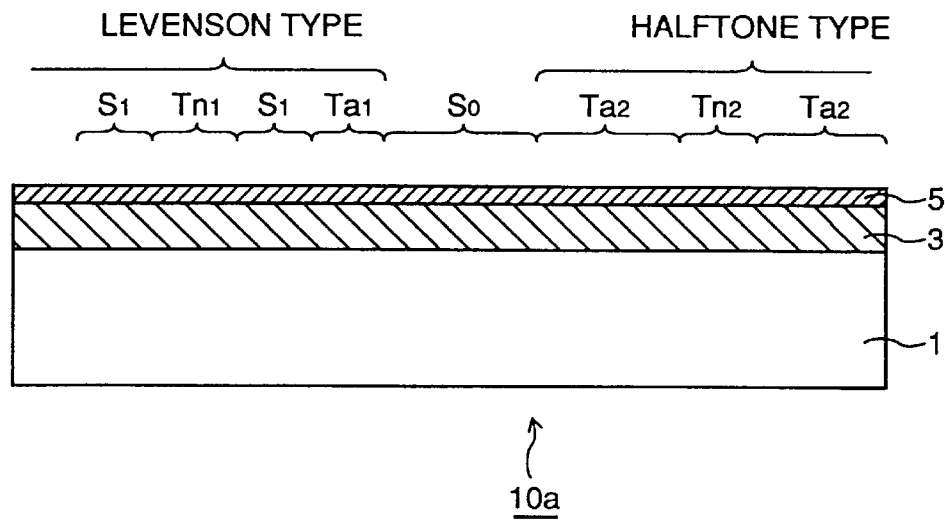
FIGS. 2–6 are schematic cross sections which show the first to fifth steps of a method of manufacturing a phase shift mask according to one embodiment of the present invention respectively.

With reference to FIG. 2 first, semi-shading shifter film 3 formed, for example, of $MoSiO_xN_y$ is deposited to a thickness of 1980 Å on the surface of quartz substrate 1 having a thickness of 6.35 mm. Shading film 5 formed, for example, of Cr is deposited to a thickness of 1000 Å on the entire surface of semi-shading film 3. A mask blank 10a is thus prepared.

Figure 3:
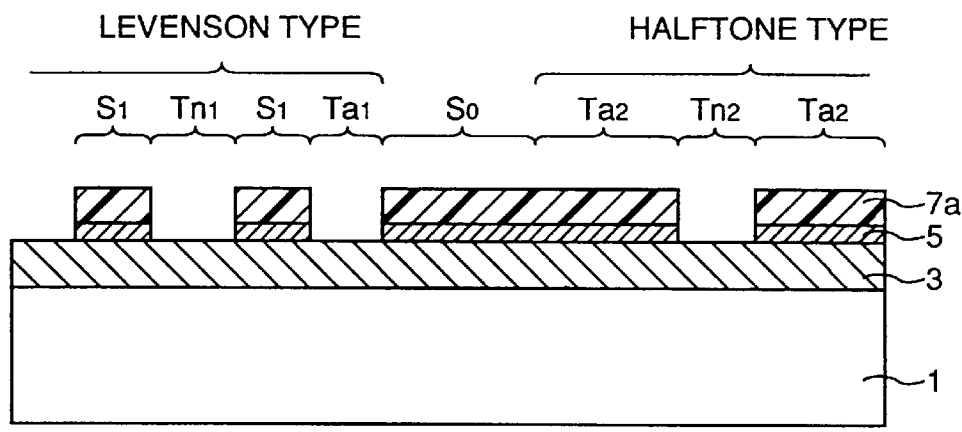

Referring to FIG. 3, shading film 5 is coated with an electron beam resist 7a having a thickness of approximately 5000 Å. Electron beam resist 7a is exposed by an electron beam (EB) exposure apparatus and developed such that it remains at shading regions $S_1$ and So as well as at the fourth light transmitting region $Ta_2$. Shading film 5 is etched by wet etching using resist pattern 7a thus formed as a mask and exposes the surface of semi-shading shifter film 3. Resist pattern 7a is thereafter removed. Defects, if any, of the pattern of shading film 5 are then inspected and repaired.

Figure 4:
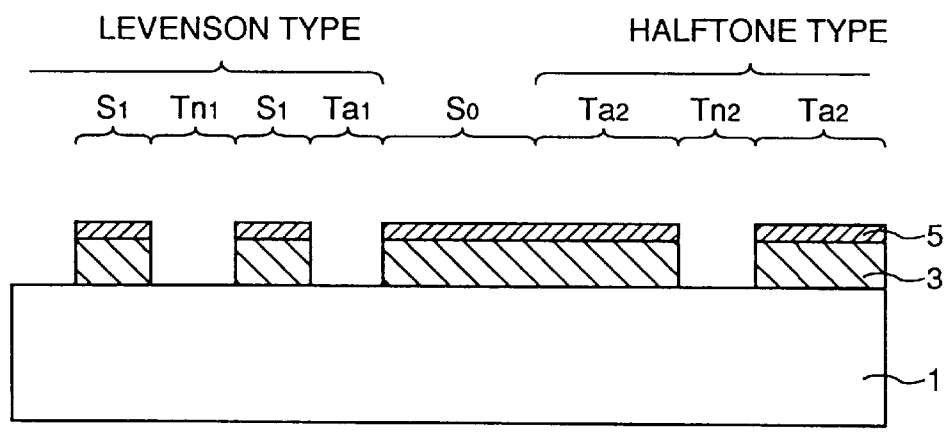

With reference to FIG. 4, semi-shading shifter film 3 is etched to be patterned through reactive ion etching (RIE) by $CF_4/O_2$ using shading film 5 as a mask. Inspection and repairing of defect, if any, are carried out for the pattern of semi-shading shifter film 3.

Figure 5:
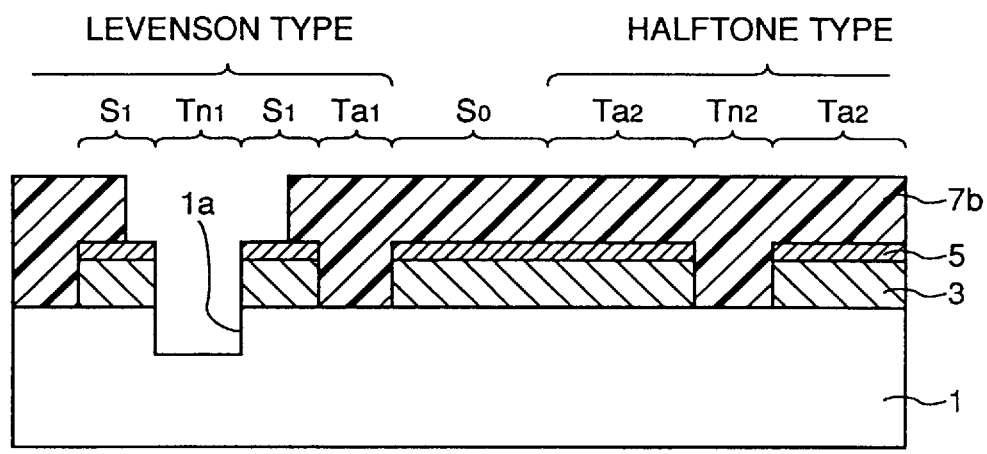

Referring to FIG. 5, the entire surface of quartz substrate 1 is coated with an electron beam resist 7b and patterned to a desired shape by the EB exposure apparatus. Electron beam resist pattern 7b is thus provided such that it exposes a surface of quartz substrate 1 at the first light transmitting region $Tn_1$. Trench 1a of quartz substrate 1 is provided through etching using electron beam resist pattern 7b as a mask.

The depth of trench 1a is approximately 4050 Å when, for example, i-line is utilized as exposure light, and approximately 2720 Å when KrF excimer laser light is utilized.

Electron beam resist pattern 7b is thereafter removed.

Figure 6:
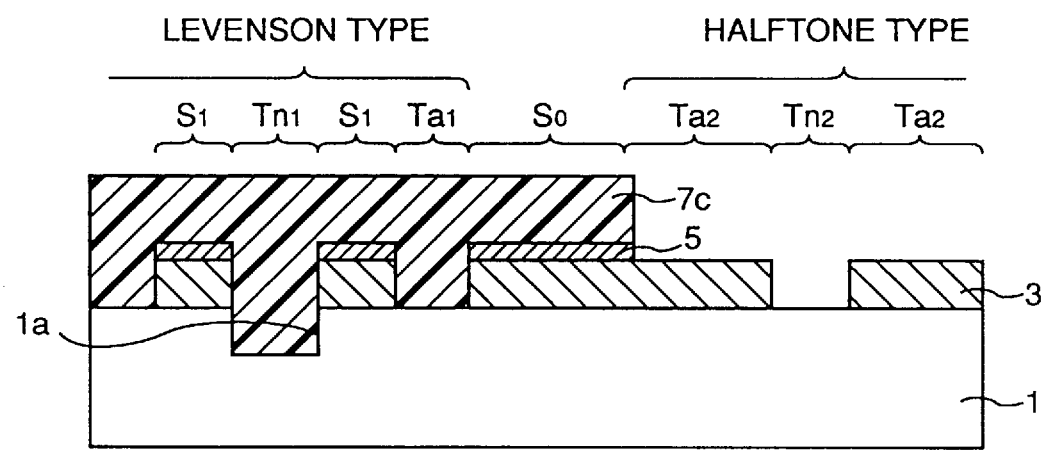

With reference to FIG. 6, the entire surface of quartz substrate 1 is again coated with an electron beam resist 7c and patterned into a desired shape by the EB exposure apparatus. Electron beam resist pattern 7c is provided such that it exposes the phase shift portion of the Halftone type. Shading film 5 of the phase shift portion of the Halftone type is removed using electron beam resist pattern 7c as a mask. Electron beam resist pattern 7c is thereafter removed and phase shift mask 10 according to the embodiment shown in FIG. 1A is completed.

Semi-shading shifter film 3 should have a transmittance of at least 3% and at most 30% for the phase shift mask according to the embodiment. This will be described below.

Figure 7:
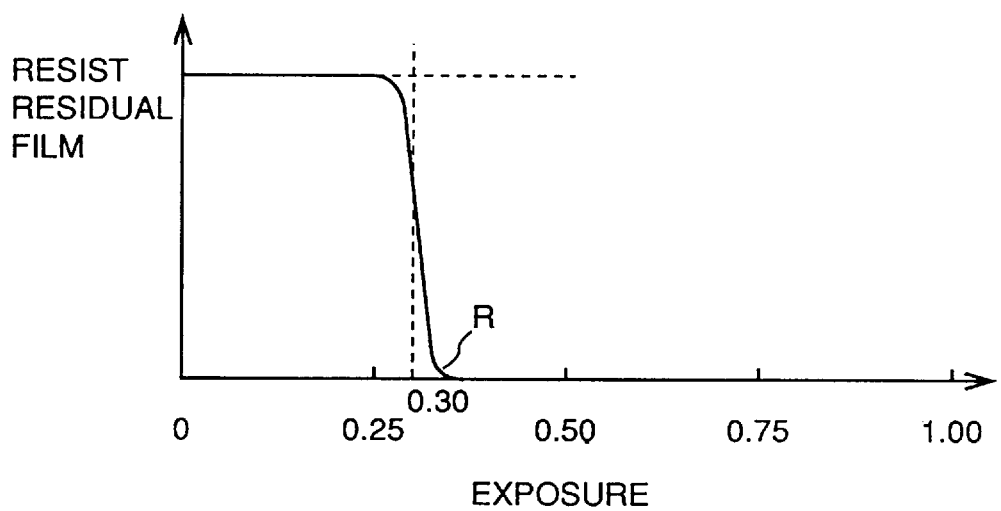
FIG. 7 shows a relation between exposure at the time of the exposure of a resist and a residual film of the resist after the development of the resist.

With reference to FIG. 7, at the time of exposure for generating an ordinary hole pattern, exposure light is directed to the mask with light intensity being about 3 to 4 times higher than that shown by R in the figure which leaves no residual film after development. Therefore, if transmittance of semi-shading shifter film 3 is larger than 30%, exposure light transmitted through semi-shading shifter film 3 leaves no film, or reduces the thickness of the photoresist, so that the resist film cannot be utilized as an etching mask. Accordingly, the transmittance of semi-shading shifter film 3 should be at most 30%.

If the intensity of light transmitted through semi-shading shifter film 3 is too weak, a sharp exposure pattern generated by the overlapping exposure light having different phases could not be obtained as described referring to FIG. 1B. Specifically, if the transmittance of semi-shading shifter film 3 is made smaller than 3%, above described effect cannot be obtained due to too small intensity of exposure light transmitted through semi-shading shifter film 3. Therefore, the transmittance of semi-shading shifter film 3 must be at least 3%.

It is thus understood that semi-shading shifter film 3 should have a transmittance of at least 3% and at most 30%.

Consideration of a width $L_1$ of shading region So between the Levenson type phase shift portion and the Halftone type phase shift portion will next be described.

Figure 8:
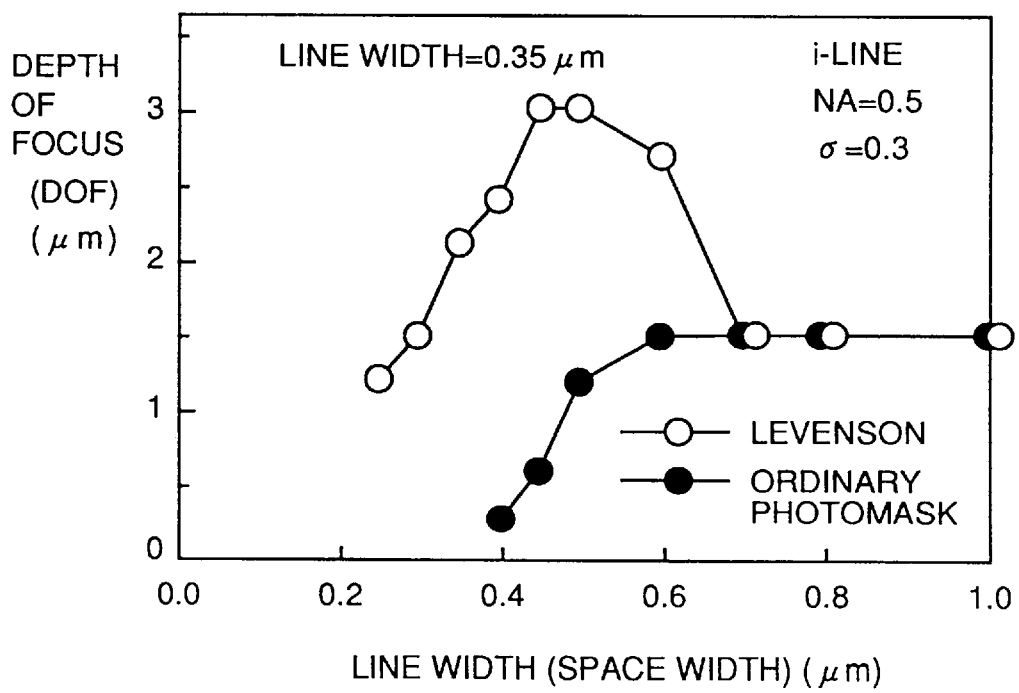
FIG. 8 shows a relation between dimension of a shading film on a wafer and depth of focus for a phase shift mask of the Levenson type and of an ordinary mark.

FIG. 8 shows a diagram shown in J. Miyazaki et al., "The effect of duty ratio of line and space in phase-shifting lithography" SPIE vol. 1927, 55, pp. 677–685. This figure is a graphical representation showing a relation between a dimension of a shading region on a wafer (Space Width) and depth of focus (DOF) for a phase shift mask of the Levenson type and of an ordinary mask.

Referring to FIG. 8, the ordinate shows depth of focus, and the abscissa shows a distance between light transmitting regions next to each other on the wafer (i.e. dimension of the shading region projected onto the wafer). As can be appreciated from this figure, depth of focus of the phase shift mask of the Levenson type becomes larger compared with the ordinary mask if the dimension of the shading region of the mask is smaller than 0.7 μm on the wafer. However, if the dimension is 0.7 μm or more, the level of the depth of focus of the Levenson type phase shift mask and the ordinary mask becomes equal, thereby generating no difference.

In this experiment, i-line having a wavelength of 0.365 μm is utilized and the dimension 0.7 μm corresponds to about two times longer (2 λ) than wavelength λ of i-line. In other words, the phase shift effect of the Levenson type cannot be achieved unless the dimension of the shading region projected onto the wafer is 2 λ or less.

A magnification of a projection optical system should be considered in order to convert the dimension of the shading region projected onto the wafer into that on the phase shift mask. Usually, a circuit pattern of the phase shift mask is demagnified by the projection optical system at a prescribed magnification and projected onto a photoresist. If the circuit pattern of the phase shift mask is demagnified to one fifth and projected onto the photoresist, the dimension of 5 μm on the phase shift mask becomes 1 μm on the photoresist through projection. Therefore, if the dimension of the shading region projected onto the wafer after reduced by the projection optical system at 1/n magnification is 2 λ, the dimension of the shading region on the phase shift mask is 2 λ×n.

If width of $L_1$ of shading region So in FIG. 1A is smaller than 2 λ×n, exposure light transmitted through the second light transmitting region $Ta_1$ and that transmitted thorough the fourth light transmission region $Ta_2$ overlap. On the other hand, if width $L_1$ is 2 λ×n or more, exposure light transmitted through the second light transmitting region $Ta_1$ and that transmitted through the fourth light transmitting region $Ta_2$ never overlap.

Considering this, width $L_1$ of shading region So between the Levenson type phase shift portion and the Halftone type phase shift portion may be determined.

In the method of manufacturing phase shift mask 10 according to the embodiment, after semi-shading shifter film 3 is patterned, trench 1a is formed at quartz substrate 1 using this semi-shading shifter film 3 as a mask as shown in FIGS. 4 and 5. In other words, after the patterning of semi-shading shifter film 3, a shifter pattern is formed. Therefore, it is not necessary to pattern semi-shading shifter film 3 in accordance with the underlying shifter pattern thus provided. Precise alignment required for the conventional example becomes unnecessary.

In the method of manufacturing according to this embodiment, semi-shading shifter film 3 which attenuates intensity of exposure light while converting the phase thereof by 180° is used. Therefore, there is no need to separately form a semi-shading film for attenuating intensity of exposure light and a shifter film for converting the phase of the exposure light by 180°. The number of steps for fabricating a film can be decreased compared with the conventional example, and simplification of the manufacturing process can thus be achieved.

In the method of manufacturing according to this embodiment, there is no need to newly form a film other than a resist after providing blank 10a shown in FIG. 2. Any defect of the film caused by forming another film after the patterning of the film or the substrate can be avoided.

As described above, in the phase shift mask according to this embodiment, highly precise alignment is unnecessary, the manufacturing process can be simplified, and the number of defects can be decreased.

Figure 9A:
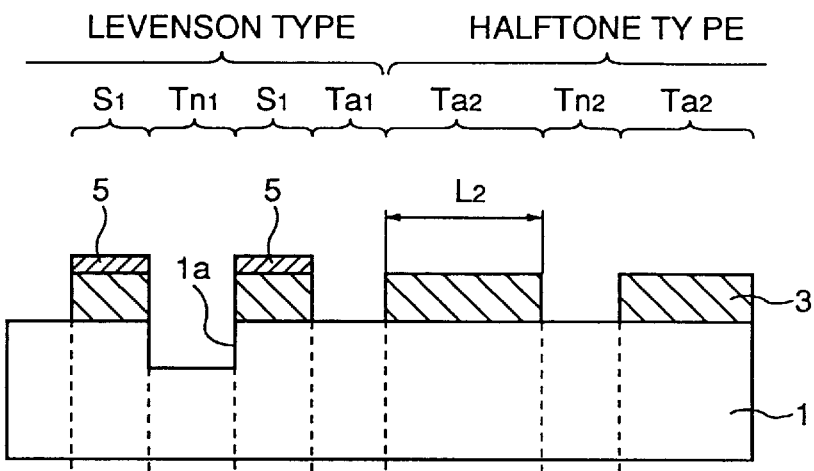
FIG. 9A schematically shows a cross section of a structure of the phase shift mask according to the embodiment of the present invention where there is no shading region between the phase shift portion of the Levenson type and that of the Halftone type.

In this embodiment, although shading region So is provided between the phase shift portion of the Levenson type and that of the Halftone type as shown in FIG. 1A, the shading region may not be formed between those regions as shown in FIG. 9A. In this case, width $L_2$ of the fourth light transmitting region $Ta_2$ adjacent to the Levenson type phase shift portion is preferably at least 2 λ×n.

Figure 9B:
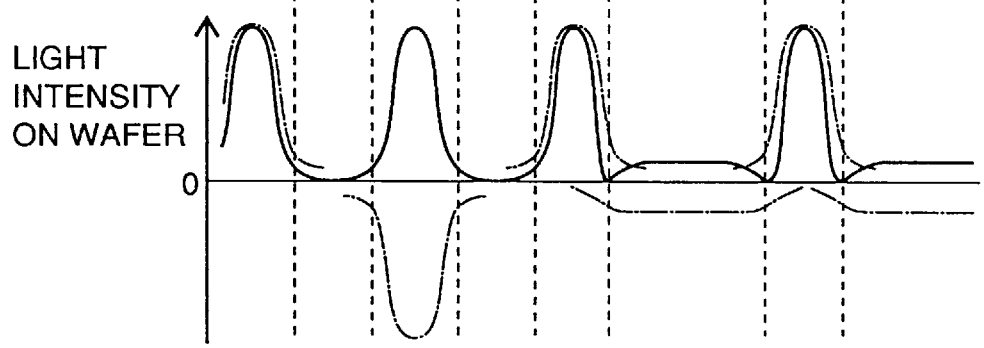
FIG. 9B shows light intensity on a wafer of exposure light transmitted through the phase shift mask of FIG. 9A.
Figure 10A:
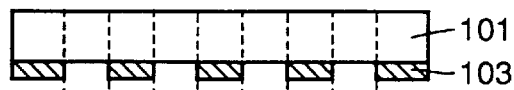
FIG. 10A shows a cross section of a mask using an ordinary photomask.
Figure 10B:
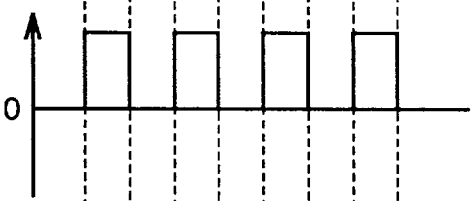
FIG. 10B shows electric field on the mask of FIG. 10A.
Figure 10C:
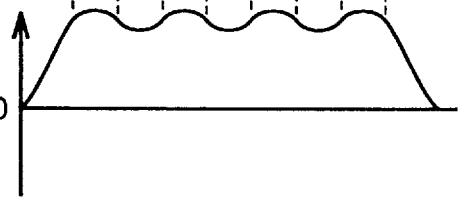
FIG. 10C shows light intensity on a wafer.
Figure 11A:
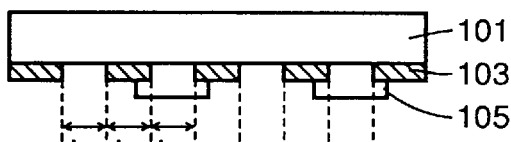
FIGS. 11A, 11B, and 11C respectively show a cross section of a mask, electric field on the mask, and light intensity on a wafer when a phase shift mask of the Levenson type is used.
Figure 11B:
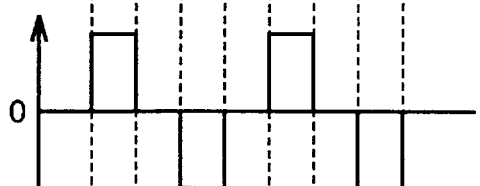
Figure 11C:
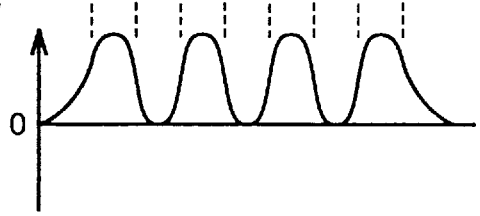
Figure 12A:
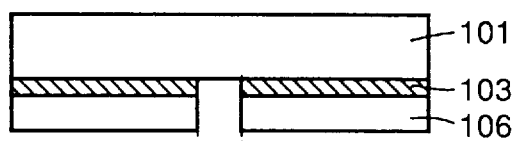
FIGS. 12A, 12B, and 12C respectively show a cross section of a mask, electric field on the mask, and light intensity on a wafer when a phase shift mask of the Halftone type is utilized.
Figure 12B:
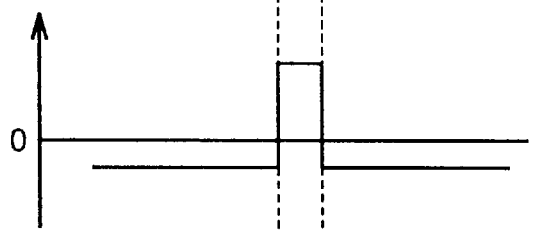
Figure 12C:
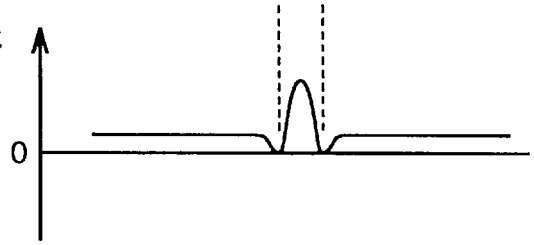
Figure 13:
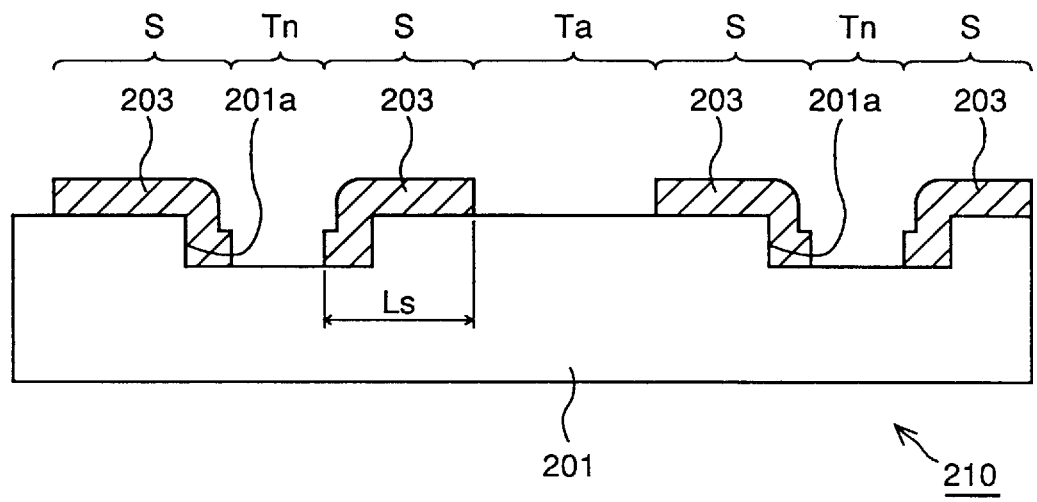
FIG. 13 schematically shows a cross section of a structure of a phase shift mask according to the first conventional example.
Figure 14:
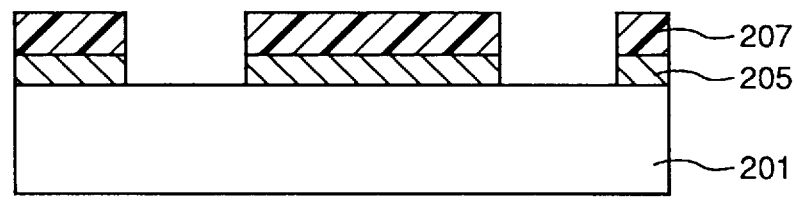
FIGS. 14–17 respectively show schematic cross sectional views of the first to the fourth steps of a method of manufacturing the phase shift mask according to the first conventional example.
Figure 15:
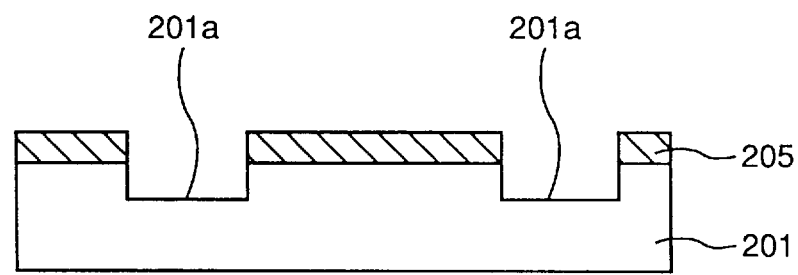
Figure 16:
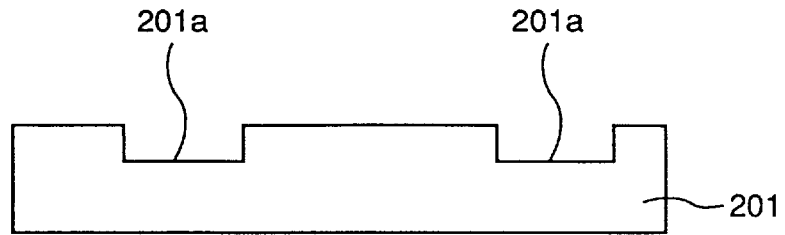
Figure 17:
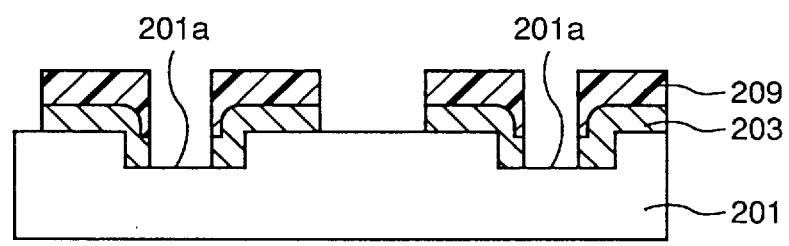
Figure 18:
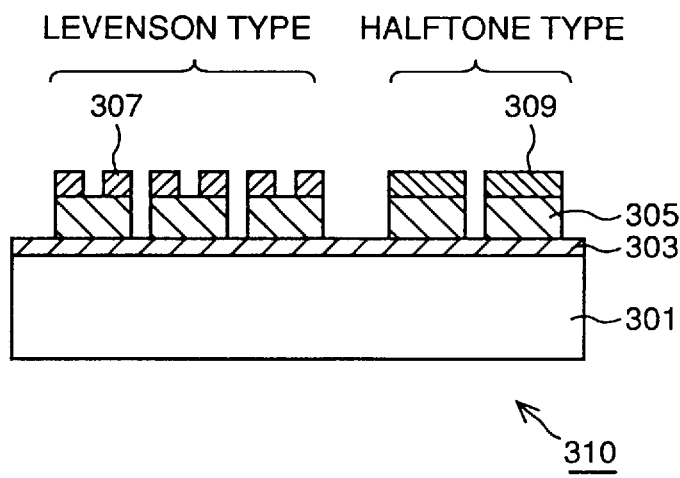
FIG. 18 schematically shows a cross section of a structure of a phase shift mask according to the second conventional example.
Figure 19:
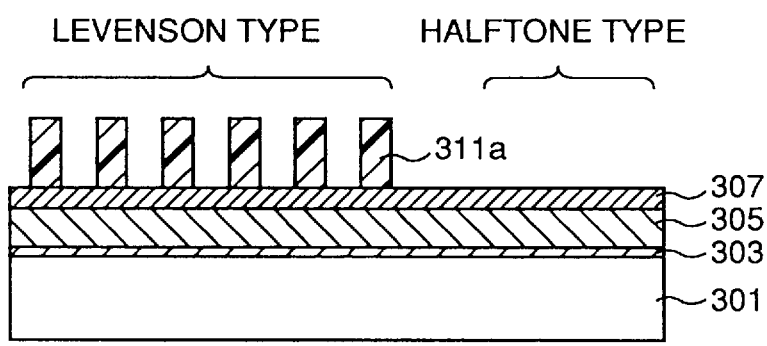
FIGS. 19–23 are schematic cross sectional views respectively showing the first to the fifth steps of a method of manufacturing the phase shift mask according to the second conventional example.
Figure 20:
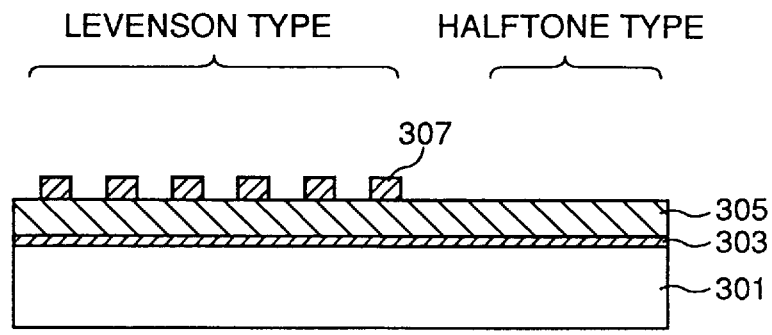
Figure 21:
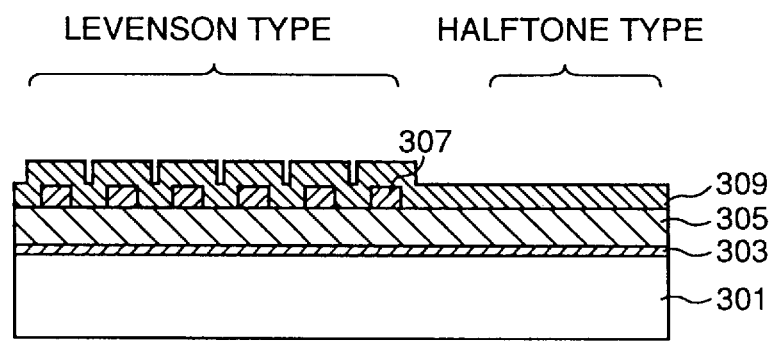
Figure 22:
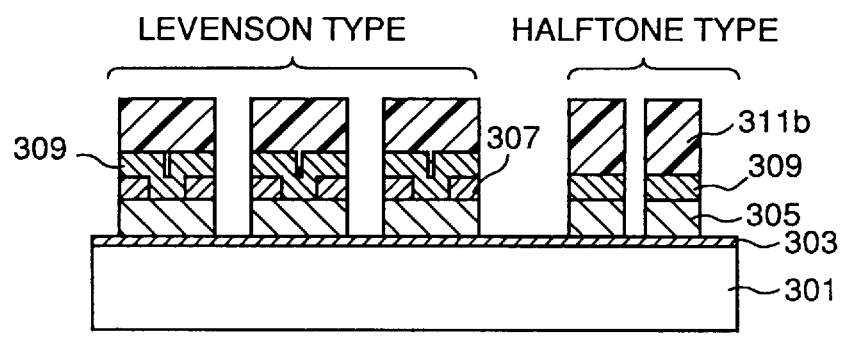
Figure 23:
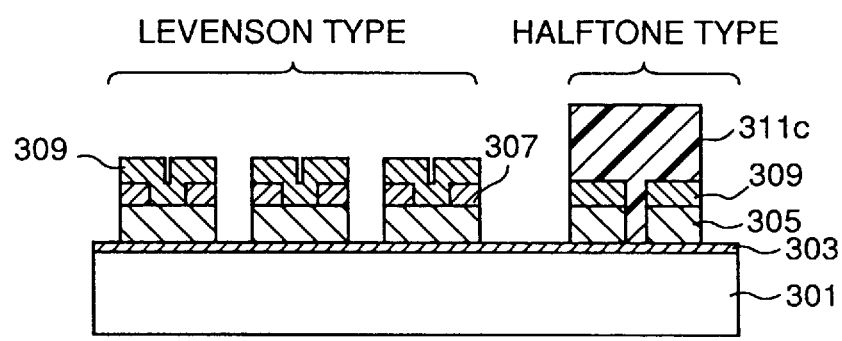

If width $L_2$ of the fourth light transmitting region $Ta_2$ is smaller than 2 λ×n, exposure light transmitted through the second light transmitting region $Ta_1$ of the Levenson type phase shift portion and that transmitted through the third light transmitting region $Tn_2$ of the Halftone type phase shift portion are overlapped in FIG. 9B, thus higher resolution cannot be obtained.

Semi-shading shifter film 3 is described as formed of MoSiO$_x$N$_y$, however, the shifter film may be formed of any of CrO$_x$N$_y$ (chromium oxide nitride), WSiO$_x$N$_y$ (tungsten silicide oxide nitride), SiO$_x$N$_y$ (silicon oxide nitride), and SiN$_x$ (silicon nitride).

Material for forming semi-shading shifter film 3 is not limited to the material described above. It may be any which has a transmittance of at least 3% and at most 30%, and converts the phase of the exposure light by about 180°.

In the embodiment described above, substrate 1 may not be of quartz, and may be formed of material having a transmittance of at least 90%.

Material for forming shading film 5 has described to be Cr above. However, it is not limited thereto. Specifically, shading film 5 may be a multi-layered film constituted by CrO/Cr/CrO, for example. Characteristics required for shading film 5 is that it does not allow transmittance of exposure light, has a good resistance to chemicals (considering washing), and has a superior adherence. Any material having those characteristics may be applied to shading film 5.

In the method of manufacturing the phase shift mask according to this invention, a trench is provided at a substrate through using a selectively removed (patterned) semi-shading shifter film as a mask. In other words, after the patterning of the semi-shading shifter film, an underlying shifter pattern is formed. Therefore, a semi-shading film is not required to be patterned in accordance with the underlying shifter pattern thus formed, so that highly precise alignment is not necessary at the time of the patterning of the semi-shading film.

A semi-shading shifter film which attenuates intensity of exposure light and converts the phase thereof by 180° is utilized. The semi-shading film and a shifter film may not be formed separately at a phase shifter portion of the Halftone type. Accordingly, the number of steps for forming the film can be reduced compared with the second conventional example, and manufacturing process can be simplified.

There is no need to form a film other than a resist after providing a blank. Any defect of a film generated by newly forming a film after patterning a film of blank or a substrate can be prevented.

As described above, in the phase shift mask of the present invention, highly precise alignment is not necessary, manufacturing process can be simplified and the number of defects can be reduced.

In the method of forming a pattern using the phase shift mask of the present invention, high resolution is achieved both at the phase shift portion of the Levenson type and that of the Halftone type. The high resolution of densely formed lines, an isolated bright line, and an isolated dark line can be attained accordingly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phase shift mask provided with a phase shift portion of Levenson type and a phase shift portion of Halftone type, comprising:

a substrate, including a first light transmitting region transmitting exposure light at said phase shift portion of Levenson type, a second light transmitting region adjacent to said first light transmitting region with a shading region therebetween and transmitting exposure light such that the phase of the exposure light is different from that of the exposure light transmitted through said first light transmitting region at said phase shift portion of Levenson type, and third and fourth light transmitting regions next to each other at said phase shift portion of Halftone type and transmitting exposure light;

a semi-shading shifter film covering a surface of said substrate at said shading region and said third light transmitting region, and exposing a surface of said substrate at said first, second, and fourth light transmitting regions; and a shading film covering an entire surface of said semi-shading shifter film at said shading region, exposing a surface of said semi-shading shifter film at said third light transmitting region, and exposing a surface of said substrate at said first, second and fourth light transmitting regions; wherein said semi-shading shifter film is formed such that it has a transmittance of at least 3% and at most 30%, and phase of exposure light after transmitted through said semi-shading shifter film is different from that before transmitted therethrough.

2. The phase shift mask according to claim 1, wherein said semi-shading shifter film is formed of at least one material selected from the group consisting of MoSiO$_x$N$_y$, CrO$_x$N$_y$, WSiO$_x$N$_y$, SiO$_x$N$_y$ and SiN$_x$.

3. A phase shift mask, comprising:

a substrate, including a first light transmitting region transmitting exposure light, and a second light transmitting region adjacent to said first light transmitting region with a shading region therebetween, and transmitting exposure light such that the phase of the exposure light is different from that transmitted through said first light transmitting region;

a semi-shading shifter film covering a surface of said substrate at said shading region and exposing a surface of said substrate at said first and second light transmitting regions; and a shading film covering an entire surface of said semi-shading shifter film at said shading region and exposing a surface of said substrate at said first and second light transmitting regions; wherein said semi-shading shifter film is formed such that it has a transmittance of at least 3% and at most 30%, and phase of exposure light after transmitted through said semi-shading shifter film is different from that before transmitted therethrough.

4. A method of manufacturing a phase shift mask provided with a phase shift portion of Levenson type and a phase shift portion of Halftone type, comprising the steps of:

forming a semi-shading shifter film and a shading film successively stacked on an entire surface of a substrate; wherein said semi-shading shifter film is formed such that it has a transmittance of at least 3% and at most 30% and phase of exposure light before transmitted through said semi-shading shifter film is different from that after transmitted therethrough, the method further comprising:

selectively removing said shading film and said semi-shading shifter film such that said shading film and said semi-shading shifter film expose a surface of said substrate at first and second light transmitting regions adjacent to each other with a shading region of said phase shift portion of Levenson type therebetween and at a fourth light transmitting region adjacent to a third light transmitting region of said phase shift portion of Halftone type, and covers a surface of said substrate at said shading region of said phase shift portion of Levenson type and said third light transmitting region of said phase shift portion of Halftone type;

forming a trench at an entire surface of said substrate where any of said first or second light transmitting regions is exposed such that phase of exposure light transmitted through said first light transmitting region is different from that transmitted through said second light transmitting region; and removing said shading film at said third light transmitting region.

5. A method of manufacturing a semiconductor device using a phase shift mask, wherein said chase shift mask is provided with a phase shift portion of Levenson type and a phase shift portion of Halftone type, comprising:

a substrate, including a first light transmitting region transmitting exposure light at said phase shift portion of Levenson type, a second light transmitting region adjacent to said first light transmitting region with a shading region therebetween and transmitting exposure light such that phase of the exposure light is different from that of the exposure light transmitted through said first light transmitting region at said phase shift portion of Levenson type, and third and fourth light transmitting regions next to each other at said phase shift portion of Halftone type and transmitting exposure light;

a semi-shading shifter film covering a surface of said substrate at said shading region and said third light transmitting region, and exposing a surface of said substrate at said first, second and fourth light transmitting regions; and a shading film covering an entire surface of said semi-shading shifter film at said shading region, exposing a surface of said semi-shading shifter film at said third light transmitting region, and exposing a surface of said substrate at said first, second and fourth light transmitting regions; wherein said semi-shading shifter film is formed such that is has a transmittance of at least 3% and au most 30%, and that phase of exposure light after transmitted through said semi-shading shifter film is different from that before transmitted therethrough, the method of manufacturing a semiconductor device comprising the steps of:

directing exposure light transmitted through said phase shift mask onto a photoresist applied to a wafer; and patterning said exposed photoresist through development.

* * * * *